United States Patent [19]

Sakurada et al.

[11] 4,298,881
[45] Nov. 3, 1981

[54] SEMICONDUCTOR DEVICE WITH DOUBLE MOAT AND DOUBLE CHANNEL STOPPERS

[75] Inventors: Shuroku Sakurada; Yoichi Nakashima; Isao Kojima; Hideyuki Yagi; Tadaaki Kariya; Masayoshi Sugiyama, all of Hitachi, Japan

[73] Assignee: Hitachi, Ltd., Tokyo, Japan

[21] Appl. No.: 138,085

[22] Filed: Apr. 7, 1980

[30] Foreign Application Priority Data

Apr. 6, 1979 [JP] Japan .................................. 54-40935

[51] Int. Cl.³ .............................................. H01L 29/47
[52] U.S. Cl. ....................................... 357/38; 357/39; 357/50; 357/52; 357/55; 357/56; 357/86
[58] Field of Search ................... 357/38, 39, 86, 36, 357/55, 56, 50, 52

[56] References Cited

U.S. PATENT DOCUMENTS

| | | | |
|---|---|---|---|
| 3,911,471 | 10/1975 | Kooi et al. | 357/50 |
| 3,918,082 | 11/1975 | Hutson | 357/38 |
| 4,079,403 | 3/1978 | Temple | 357/38 |
| 4,092,703 | 5/1978 | Sueoka et al. | 357/38 |
| 4,148,053 | 4/1979 | Bosselaar et al. | 357/50 |
| 4,156,250 | 5/1979 | Trap | 357/38 |

FOREIGN PATENT DOCUMENTS 2305854 10/1976 France .................................. 357/38

*Primary Examiner*—Joseph E. Clawson, Jr.
*Attorney, Agent, or Firm*—Craig and Antonelli

[57] ABSTRACT

This invention concerns a so-called double-moat unisurface type semiconductor device in which two concentric moats are provided in one main surface of the substrate and the edges of the two pn-junctions for blocking main circuit voltages applied to the device are exposed in the surfaces of the moats. Semiconductor layers having high impurity concentrations and serving as channel stoppers are formed on the semiconductor layers exposed in the one main surface of the substrate, contiguous to the moats and spaced apart from the pn-junctions, each high impurity concentration layer having the same conductivity type as the semiconductor layer on which it is formed. The moats are filled with surface passivating material.

7 Claims, 14 Drawing Figures

SEMICONDUCTOR DEVICE WITH DOUBLE MOAT AND DOUBLE CHANNEL STOPPERS

This invention relates to a structure of a semiconductor element intended for high voltage use.

In a highly reliable semiconductor device having a high withstand voltage, moats in which the edges of the pn-junctions are exposed, are formed in the surface of the substrate and the moats are filled with surface passivation material.

Moat-passivated type semiconductor device using glass as surface passivating material finds its application especially in thyristors having a withstand voltage of 200–600 V. However, according to the conventional technology, it is very difficult to fabricate a thyristor having a withstand voltage of higher than 700 V, especially higher than 1000 V, by employing such moat-passivated structure.

The most relevant reason for this is as follows. In the moat passivation process, the edges of the pn-junctions for blocking the main voltage are usually shaped by etching. By etching, however, it is difficult to control the junction edge angle (i.e. bevel angle) which is one of the most important factors to determine the withstand voltage, and therefore the electric field tends to be intense at the edge of the pn-junction.

To decrease the field intensity at the edge of the pn-junction and therefore to obtain a moat-passivated type semiconductor device having a high withstanding voltage, it is necessary for a thyristor to have lower impurity concentrations at the edges of the pn-junctions than the conventional thyristors. Incidentally, however, the lower the impurity concentration is in a semiconductor element, the greater is the chance of a conductivity type inverted layer, i.e. channel, being formed at the interface. Upon appearance of a channel, leakage current under the application of the main voltage increases considerably and also the reliability of withstand voltage is degraded especially at high temperatures. Electric charges induced at the interface between the semiconductor and the insulating material give rise to a channel. If the charges at the interface are negative, a p-type channel is formed on the n-type layer side of the pn-junction while if the charges are positive, an n-type channel is formed on the p-type layer side of the pn-junction. The polarity of the electric charges induced at the interface depends on the property of the insulator filling the moat and it is possible to control the charges to negative or positive polarity. In a thyristor having a withstand voltage of higher than 1000 V, however, since both the p-type layer and the n-type layer for forming the pn-junction for blocking the main voltage have low impurity concentrations, a channel tends to be formed irrespective of whether the charges are of negative or positive polarity. Accordingly, the reliability of withstand voltage is adversely affected. Moreover, it is difficult even for the moat passivation technology in current use to cause interface charges to vanish with high repeatability. Even though the charges be controlled to zero, the atmosphere around the glass layer might cause electric charges to be induced at the glass-semiconductor interface. Thus, the moat passivation technology has a difficulty in the control of bevel angle and interfacial charges so that it can hardly produce a highly reliable semiconductor device having a high withstand voltage. A double-moat and channel-stopper arrangement somewhat related with this invention is described in for example, U.S. Pat. No. 4,148,053 issued Apr. 3, 1979.

It is therefore an object of this invention to provide a highly reliable, moat-passivated type semiconductor device having a high withstand voltage.

Another object of this invention is to provide a semiconductor device which can withstand a high main circuit voltage irrespective of whether negative or positive charges are induced at the interface between the semiconductor and the passivating material filling the moat.

Still another object of this invention is to provide a semiconductor device which can provide a high withstand voltage even though the shape of the formed moat is slightly deviated from the predetermined one.

According to this invention, which has been made to attain the above objects, there is provided a semiconductor device having a semiconductor substrate comprising at least three semiconductor layers with alternately opposite conductivity types, wherein two concentric moats are formed in one of the main surfaces of the substrate; the edges of the pn-junctions each formed between the semiconductor layers having opposite conductivity types are exposed in the surface of the moats; semiconductor layers having high impurity concentrations are formed on the semiconductor layers exposed in the one main surface of the substrate, contiguous to the moats and apart from the pn-junctions, each of the layers having a high impurity concentration having the same conductivity type as the layer on which it is formed; the moats are filled with surface passivating material; and main electrodes are provided on both the main surfaces of the substrate.

Figure 3:
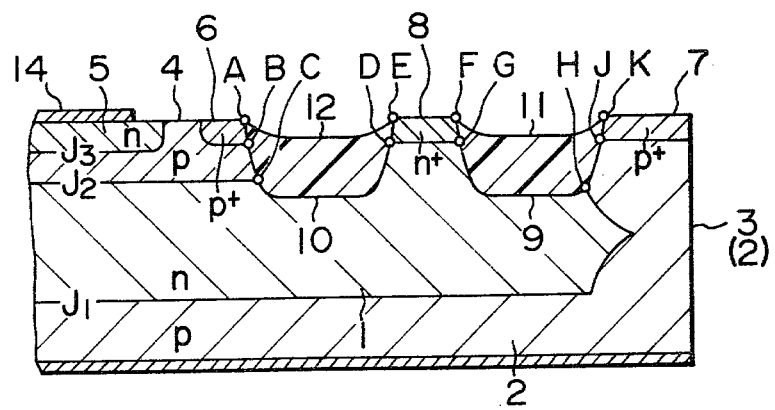
FIG. 3 shows on an enlarged scale a principal portion of the structure shown in FIG. 2.
Figure 4:
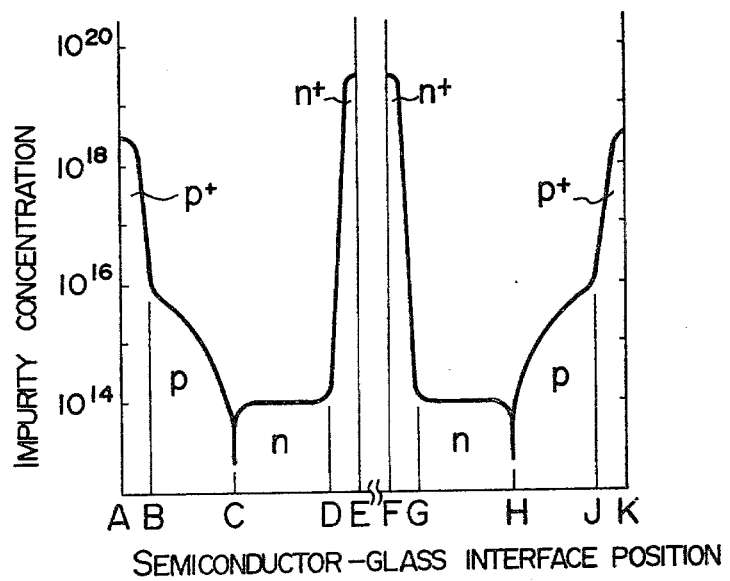
Figure 9:
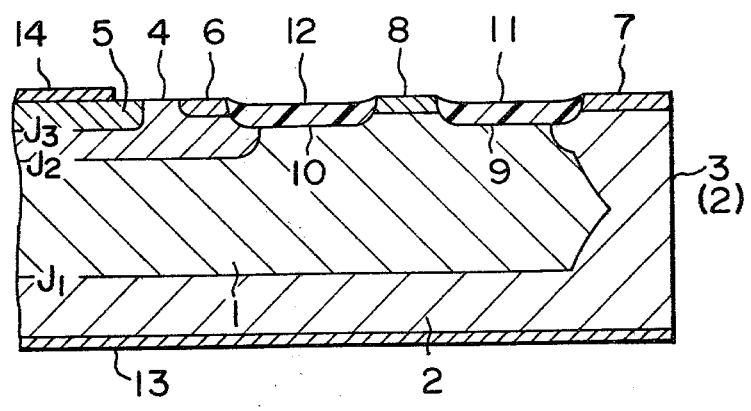
Figure 10:
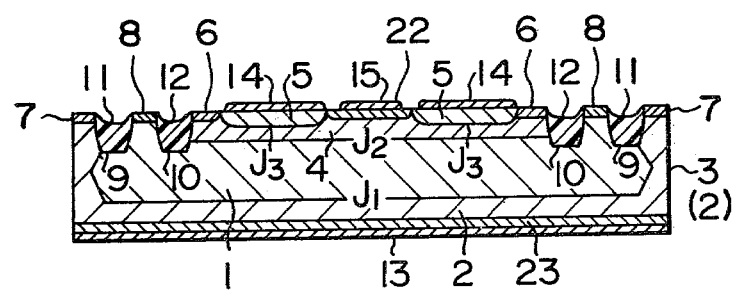
Figure 11:
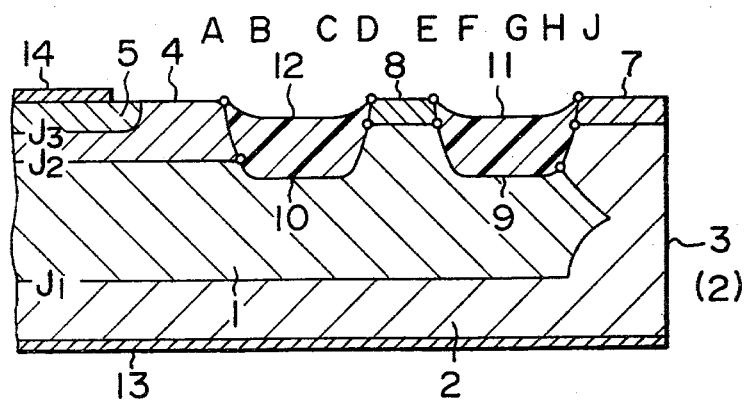
Figure 12:
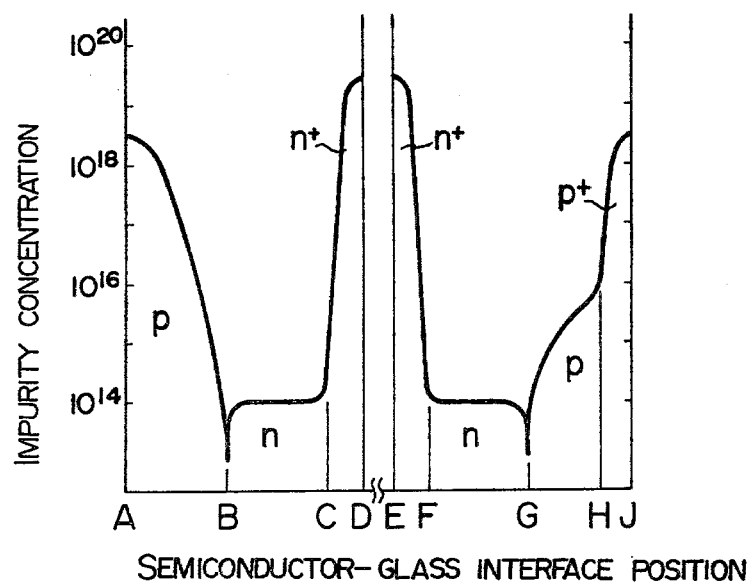
Figure 13:
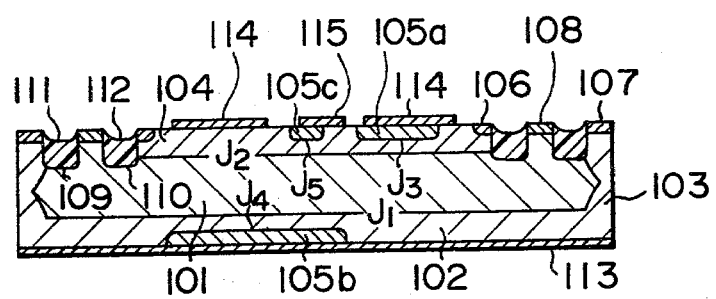
Figure 14:
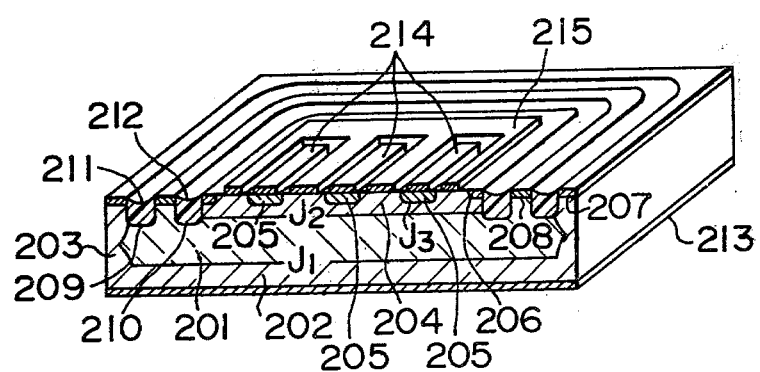

FIG. 4 graphically shows the distributions of concentrations of impurities at the interfaces between semiconductor pellet and glass in the structure shown in FIG. 3;

FIG. 5 to FIG. 8 illustrate the effect obtained according to this invention;

FIG. 9 to FIG. 11 show in cross section thyristors as other embodiment of this invention;

FIG. 12 graphically shows the distributions of the impurity concentrations in the interface between semiconductor pellet and glass in the structure shown in FIG. 11;

FIG. 13 shows in cross section a bidirectional thyristor pellet as another embodiment of this invention; and FIG. 14 shows in oblique view with a cross section a gate turnoff thyristor pellet as another embodiment of this invention.

Figure 1:
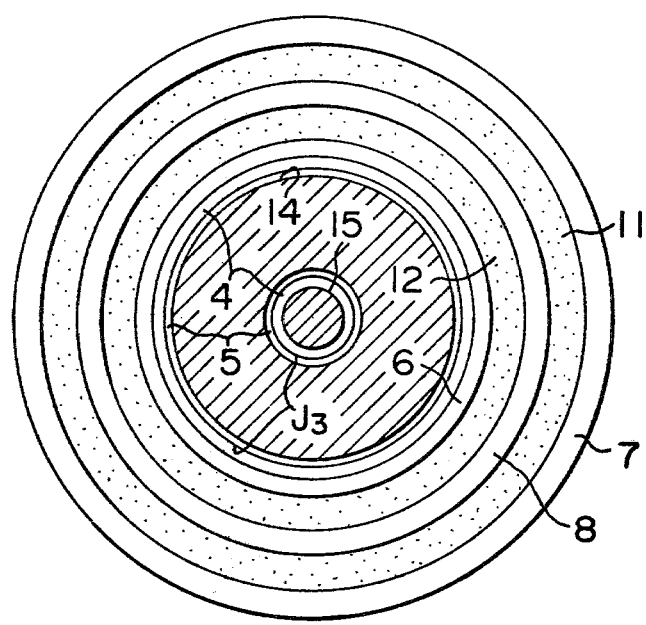
FIG. 1 shows in plan a thyristor pellet as an embodiment of this invention.
Figure 2:
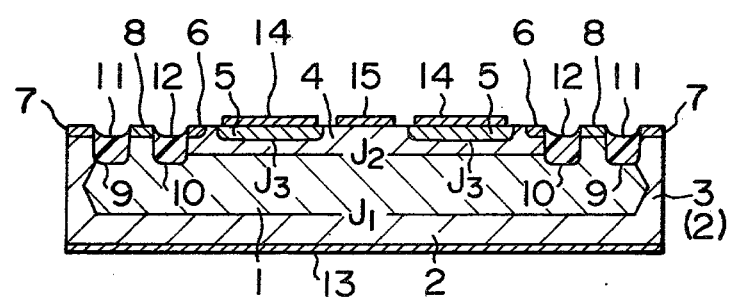
FIG. 2 is a cross section taken along a diameter of the thyristor pellet shown in FIG. 1.

FIGS. 1 and 2 show, respectively in plan and cross section, a thyristor as an embodiment of this invention. As shown in these figures, a thyristor pellet (element) comprises an n-base layer 1, a p-emitter layer 2, a p-base layer 4 and an n-emitter layer 5, defining pn-junctions $J_1$, $J_2$ and $J_3$ respectively. A through-diffusion region 3 (electrically an extended portion of the p-emitter layer 2) is provided in the peripheral region of the thyristor pellet so that the pn-junction $J_1$ may be exposed in the main surface where the pn-junctions $J_2$ and $J_3$ are exposed. It is here to be noted that the main voltage applied to the thyristor is withstood by the pn-junction $J_1$ (in the reverse direction) and the pn-junction $J_2$ (in the forward direction). In the main surface where the pn-junctions $J_1$, $J_2$ and $J_3$ are exposed, are cut two concentric grooves (hereafter referred to as moats) 9 and 10 which are to be filled with glass for covering the edges of the pn-junctions $J_1$ and $J_2$ appearing in the moats 9 and 10, respectively. These moats 9 and 10 may be formed by etching. A layer 6 having a high concentration of p-type impurity (hereafter referred to as p+-layer) is formed in the portion of the p-base layer 4 exposed in the moat 10, spaced from the pn-junction $J_2$. In like manner, a p+-layer 7 is formed in the portion of the p-emitter layer 2 exposed in the moat 10, spaced from the pn-junction $J_1$. A layer 8 having a high concentration of n-type impurity (hereafter referred to as n+-layer) is formed in the portion of the n-base layer exposed in the moats 9 and 10, spaced from the pn-junctions $J_1$ and $J_2$.

The moats 9 and 10 are filled with glass 11 and 12 serving as a material for passivating a semiconductor surface so that the pn-junctions $J_1$ and $J_2$ are protected from ambient conditions. An anode electrode 13, a cathode electrode 14 and a gate electrode 15 are provided respectively on the p-emitter layer 2, the n-emitter layer 5 and the p-base layer 4.

The upper main surface in which the pn-junction $J_3$ is exposed, except the surfaces of the moats 9 and 10 and the electrodes 14 and 15, is covered by an insulating film (not shown) such as a silicon oxide film. In FIG. 1, the moats 9 and 10 are identified by the dot-dispersed regions and the electrodes 14 and 15 by the hatched ones.

With the thyristor pellet shown in FIGS. 1 and 2, the pellet diameter is 12.5 mm; the n-base layer 1 has a resistivity of 90 $\Omega$cm and a thickness of 250 $\mu$m; the p-emitter layer 2 has an impurity concentration of at most $10^{16}$ atoms/cm$^3$ and a diffusion thickness of 85 $\mu$m; the p-base layer 4 has an impurity concentration of at most $10^{16}$ atoms/cm$^3$ and a resistance of 800 $\Omega$ across the layer between the pn-junctions $J_2$ and $J_3$, and a thickness of 60 $\mu$m; the n-emitter layer 5 has a surface impurity concentration of $10^{19}$–$10^{20}$ atoms/cm$^3$ and a thickness of 25 $\mu$m; each of the p+-layers 6 and 7 has a surface impurity concentration of $10^{18}$–$10^{19}$ atoms/cm$^3$ and a thickness of 15 $\mu$m; the n+-layer 8 has a surface impurity concentration of $10^{19}$–$10^{20}$ atoms/cm$^3$ and a thickness of 25 $\mu$m; each of the moats 9 and 10 has a width of 450 $\mu$m and a depth of 150 $\mu$m; and the glass layers 11 and 12 have a thickness of 100 $\mu$m, completely filling the moats 9 and 10. The n-emitter layer 5 is provided with an emitter short-circuiting structure to improve the forward withstand voltage, but the emitter short-circuiting structure is not shown.

FIG. 3 shows on an enlarged scale a part of the structure shown in FIG. 2, in which A–K indicate the positions of points along the interfaces between the glass layers and the semiconductor layers, as shown in FIG. 2. FIG. 4 graphically shows the distributions of impurity concentration along the surface of the moats 9 and 10, i.e. above mentioned interfaces. FIGS. 3 and 4 depict the foregoing description through graphical representation for the facility of understanding.

The effects obtained according to this invention will be described below.

As described before, under application of a voltage, channels may be formed in both the p- and n-layers owing to the charges induced at the interfaces between the glass layers and the semiconductor layers. The channel is formed when the amount of the induced charges exceeds $10^{12}$, $10^{11}$ or $10^{10}$ quanta of electricity/cm$^2$ in the case where the impurity concentration is $10^{18}$, $10^{17}$ or $10^{16}$ atoms/cm$^3$. Naturally, the channel is formed in the p-layer when positive charges are induced there and in the n-layer when negative charges are induced there.

The p+- and n+-layers 6, 7 and 8, which are characteristic of this invention, serve as stoppers for these channels.

Figure 5:
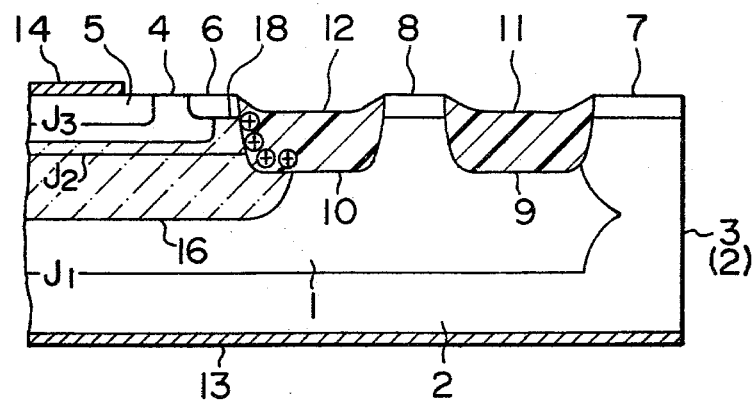
Figure 6:
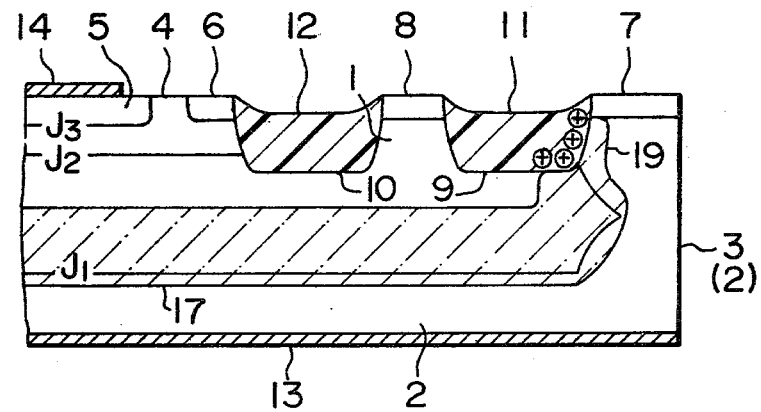

FIGS. 5 and 6 correspond to the case where the amount of induced charges at the interface is $+1 \times 10^{12}$ quanta/cm$^2$, that is, positive charges are induced. FIG. 5 shows the state in which a voltage of 1600 V is forwardly applied to and withstood by the structure.

The positive interface charges cause an n-type channel 18 to extend from a depletion layer 16 to the surface of the moat 10 in the p-base layer 4.

In the thyristor pellet according to this invention, however, since the p+-layer 6 for stopping the n-channel 18 is disposed apart from the pn-junction $J_2$ and exposed in the surface of the moat 10 in the p-base layer 4, then the n-channel 18 reaches but does not penetrate the p+-layer 6. Namely, the channel is bounded by the interface passivated by the inactive layer of glass. Accordingly, the depletion layer 16 inclusive of the n-channel 18 is covered and protected by the passivation layer 12 of glass so that leak current under the application of a voltage can be reduced and therefore that the stability of the voltage withstand characteristic especially at high temperatures can be much improved.

Moreover, the p+-channel stopping layer 6 serves also to prevent the channel from penetrating the p-base layer 4 and a short-circuiting path from being established between the n-base layer 1 and the n-emitter layer 5.

FIG. 6 shows the state in which a voltage of 1600 V is reversely applied to and withstood by the structure.

In this case, an n-type channel 19 is formed and reaches the surface of the moat 10 in the p-emitter layer 2. The n-channel 19 is bounded also in this case by the p+-channel stopping layer 7 which is disposed apart from the pn-junction $J_1$ and exposed in the surface of the moat 9 in the p-emitter layer 2, and covered by the passivation layer 11 of glass so that the same stability as above can be obtained.

On the other hand, according to the thyristor embodying this invention, even though negative charges are induced at the interface, the n+-channel stopping layer 8 provided on the n-base layer 1 plays its role effectively.

Figure 7:
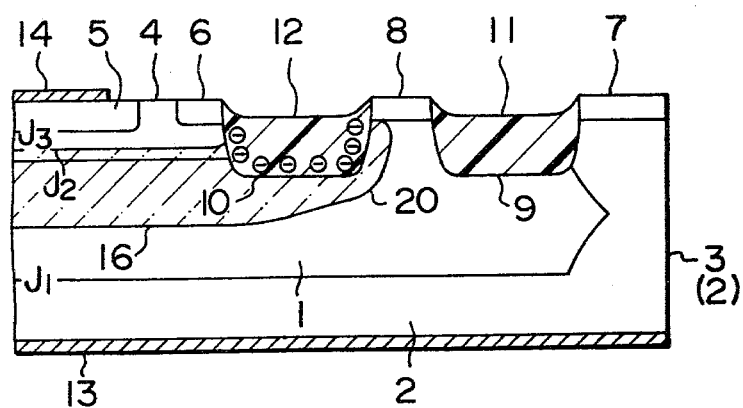
Figure 8:
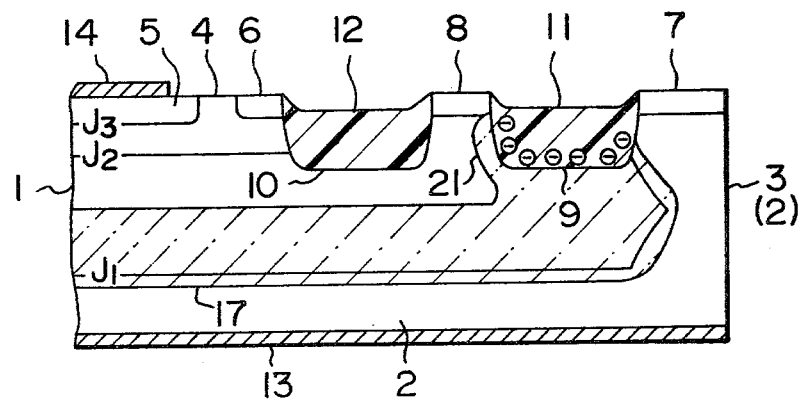

FIGS. 7 and 8 correspond to the case where the amount of charges induced at the interface is $-1 = 10^{12}$ quanta/cm$^2$, that is, negative charges are induced. FIG. 7 shows the state in which a voltage of 1600 V is forwardly applied to and withstood by the structure and FIG. 8 shows the case where the polarity of the voltage in FIG. 7 is reversed.

In the case of negative charges being induced at the interfaces, p-type channels 20 and 21 extend from depletion layers 16 and 17 to the surfaces of the moats 10 and 9 in the n-base layer 1, as shown respectively in FIGS. 7 and 8. However, since the n+-channel stopping layer 8 is provided on the n-base layer 1, apart from the pn-junctions $J_1$ and $J_2$ and exposed in the surfaces of the moats 9 and 10, than the channels 20 and 21 are prevented from penetrating the n-base layer 1 and also a short-circuiting path is prevented from being established between the p-base layer 4 and the p-emitter layer 2.

In general, the concentration of the charges at the interface can be controlled to $\pm 1 \times 10^{12}$ quanta/cm$^2$ through the process of passivating the moat by glass and even to $\pm 3 \times 10^{11}$ quanta/cm$^2$ by a process with specifically high precision. As well known, however, the amount of the interface charges are easily changed by contamination or ambient atmosphere in the later steps of process such as steps of forming electrodes and assembling or during shelf life.

On the other hand, according to the moat passivation type thyristor embodying this invention, the p$^+$- and n$^+$-channel stopping layers 6, 7 and 8 play effectively their roles, irrespective of whether the interface charges are positive or negative, as described before. According to this invention, therefore, a stable voltage withstand characteristic considerably independent of the fluctuations of various conditions in the process and the ambient atmosphere can be obtained. An application of this invention is especially recommended to a thyristor used under high voltages which has low impurity concentrations in its p- and n-base layers and therefore in which a channel is likely to be formed. As a result of the application of this invention, the production of a moat passivation type thyristor having a withstand voltage of higher than 1000 V has been possible.

The inventors fabricated for a test thyristors having the above mentioned structure and the thyristors withstood a voltage of 1600 V in both forward and reverse directions and the leakage current was less than 3 mA when the pn junctions are kept at 125° C. Under the application of a high voltage for a long time, they caused no abnormal phenomenon such as breakdown or increase in leakage current, but exhibited high reliability.

This invention is by no means limited to the embodiment described above and other numerous variations or modifications will be possible within the scope and spirit of this invention. Some examples of such variations will be explained next.

FIG. 9 shows in cross section a so-called shallow-moat glass-passivated type thyristor in which the depths of moats 9 and 10 formed by etching are smaller than the depth of the pn-junction $J_2$. In general, the process of passivating the moats with glass has a drawback that the semiconductor wafer has a poor splitting yield in steps later than that of forming the moats. The shallow-moat glass passivated type structure shown in FIG. 9 is advantageous in that the moats 9 and 10 can be easily formed and also that the splitting yield is improved. With this structure, however, the pn-junction $J_2$ has curvatures which cause higher concentration of electric fields degrading the voltage withstand characteristic.

In a thyristor pellet shown in FIG. 10, p$^+$-layers 22 and 23 are formed for providing ohmic contact with electrodes simultaneously when p$^+$-channel stopping layers 6 and 7 are formed. As described above, the p$^+$-channel stopping layers 6 and 7 have surface impurity concentrations of $10^{18}$–$10^{19}$ atoms/cm$^3$, which are insufficient for providing an ohmic contact between the semiconductor element and electrodes of Al, Cr or Ti. Since a thyristor having a high withstand voltage has low diffused impurity surface concentrations in the p-base and the p-emitter layers, impurity atoms should preferably be re-diffused at high concentrations to provide ohmic contacts. In that case, it is preferable from the standpoint of cost reduction to form the p$^+$-channel stopping layers 6 and 7 and the ohmic contact layers 22 and 23 simultaneously, as shown in FIG. 10. Moreover, if the n-emitter layer 5 and the n$^+$-channel stopper layer 8 have surface impurity concentrations of more than $10^{19}$–$10^{20}$ atoms/cm$^3$, the above formation of the p$^+$-layers by diffusion process need not be selective, but may be performed on the entire surface. Further, the n-emitter layer 5 and the n$^+$-channel stopping layer 8 may be formed through a single diffusion process.

FIGS. 11 and 12 show another embodiment of this invention.

The gist of this invention is the provision of two moats for the pn-junctions $J_1$ and $J_2$ which serve to withstand the main voltage and the provision of the regions having high impurity concentrations inside and outside the moats, the regions functioning effectively as channel stoppers.

In a pnpn-type thyristor, for example, if the surface impurity concentration of the p-base layer is high enough for the p-base layer to serve as a stopper for the n-type channel extending to the surface of the moat in the p-base layer under the application of a forward voltage, the p-base layer itself may be used as a channel stopper according to this invention.

FIG. 11 shows in cross section a thyristor having such a structure as described above.

It is necessary to cause the n-emitter layer 5 not to be exposed in the surface of the moat 10 in order for the diffused p-base layer 4 to serve as a channel stopper.

FIG. 12 graphically shows the distribution of impurity concentrations along the surfaces of the moats 9 and 10 shown in FIG. 11. The maximum impurity concentration in the surface of the moat 10 in the p-base layer 4 is $10^{18}$–$10^{19}$ atoms/cm$^3$ and this high impurity concentration enables the p-base layer 4 to be used as a channel stopper.

Thyristors of rated withstand voltages up to 600 V usually have surface impurity concentrations of $10^{18}$–$10^{19}$ atoms/cm$^3$ in their p-base layers. Therefore, by selectively forming the n-emitter layer 5 so that it may not be exposed in the surface of the moat 10, as shown in FIGS. 11 and 12, the channel stopper can be formed through the formation of the p-base layer itself. Also, in this step of formation, the p$^+$-channel stopping layer 7 is simultaneously formed in the p-emitter layer 2. In this invention, passivating material to fill the moats is not limited to glass, but any other suitable insulating, inactive material for the treatment of semiconductor surface such as silicon resin or polyimide resin can be used. Further, the effect obtained by this invention can also be enjoyed even though the surface of the moat is coated with a thin film of silicon oxide or tantalum oxide.

This invention can be applied to a five-layer, bidirectional thyristor called triac by trade name, a thyristor having a property of gate turnoff or a transistor which is to have a good blocking characteristic in both forward and reverse directions.

FIG. 13 shows in cross section a five-layer bidirectional thyristor as another embodiment of this invention.

In FIG. 13, the pellet of this thyristor comprises an n-base layer 101, a p-emitter layer 102, a p-base layer 104, n-emitter layers 105a and 105b, and an auxiliary n-emitter layer 105c, these layers defining pn-junctions $J_1$–$J_5$ therebetween. A through-diffusion region 103 is formed in the peripheral portion of the thyristor pellet and the through-diffusion region 103 forms an extention of the p-emitter layer 102. Moats 109 and 110 are cut by etching in the upper main surface of the pellet and the pn-junctions $J_1$ and $J_2$ are exposed in the surface of the moats 109 and 110, respectively. A p-type layer 106 having a high impurity concentration is formed in the surface region of the p-base layer 104 near the moat 110, spaced from the pn-junction $J_2$. A p-type layer 107 having a high impurity concentration is formed in the surface of the through-diffusion region 103 near the moat 109, spaced from the pn-junction $J_1$. An n-type layer 108 having a high impurity concentration is formed in the surface portion of the n-base layer 101 between the moats 109 and 110, spaced from the pn-junctions $J_1$ and $J_2$. The moats 109 and 110 are filled with sintered glass layers 111 and 112 for surface passivation. A first main electrode 113 is kept in ohmic contact with the lower main surface in which the p-emitter layer 102 and the n-emitter layer 105b are exposed. On the upper main surface, a second main electrode 114 is kept in ohmic contact with the p-base layer 104 and the n-emitter layer 105a, and a gate electrode 115 is kept in ohmic contact with the p-base layer 104 and the auxiliary n-emitter layer 105c.

The upper main surface, except the surfaces of the glass layers 111 and 112 and the electrodes 114 and 115, is coated with an insulating film (not shown) of, for example, silicon oxide.

The detailed description of the turnoff operation of the thyristor under consideration will be omitted. When a main circuit voltage is applied between the first and second main electrodes 113 and 114, with the potential at the first main electrode kept more positive than that at the second main electrode, the pnpn-structure consisting of p-emitter layer 102, n-base layer 101, p-base layer 104 and n-emitter 105a functions as a thyristor. The turnon of the thyristor takes place when a gating voltage is applied between the second main electrode 114 and the gate electrode 115, irrespective of the polarity of the potential at the gate electrode 115. On the other hand, if a main circuit voltage is applied between the first and second main electrodes 113 and 114, with the potential at the second main electrode 114 kept more positive than that at the first main electrode, the pnpn-structure consisting of p-base layer 104, n-base layer 101, p-emitter layer 102 and n-emitter layer 105b functions as a thyristor. The turning-on of this thyristor takes place when a gating voltage is applied between the gate electrode 115 and the second main electrode 114, irrespective of the polarity of the potential at the gate electrode 115.

The main circuit voltage with its more positive potential at the first main electrode is blocked (or withstood) mainly by the pn-junction $J_2$ while the main circuit voltage with its more positive potential at the second main electrode is blocked mainly by the pn-junction $J_1$. Accordingly, the way of blocking the main voltage is the same as in the thyristor pellet shown in FIGS. 1 and 2. Thus, the layers 106, 107 and 108 of high impurity concentration serve as channel stoppers, as shown in FIGS. 5-8.

FIG. 14 shows in oblique view a gate turnoff thyristor as another embodiment of this invention.

This thyristor is different from those shown in FIGS. 1 and 2 in that the shape of the pellet is square and that a plurality of n-emitter layers are used as surrounded by a gate electrode.

The other parts, which are equivalent to the corresponding members of the thyristor shown in FIGS. 1 and 2, are designated by such reference numerals as constructed by adding 200 to the numerals of the corresponding members.

If a main circuit voltage applied between the cathode and anode electrodes 214 and 213 has its anode potential more positive than its cathode potential, it is blocked mainly by the pn-junction $J_2$. On the other hand, if the polarity of the main circuit voltage is reversed, it is blocked mainly by the pn-junction $J_1$. In both of these cases, the layers 206, 207 and 208 of high impurity concentration serve as channel stoppers, as described with FIGS. 5-8.

It should here be noted that this invention is by no means limited to the semiconductor devices having shapes as described above and shown in the attached drawings, but may be applied to semiconductor substrates having arbitrary shapes and sizes.

As described above, according to this invention, if two moats are provided for the two pn-junctions for withstanding main voltages and if the $p^+$- and $n^+$-channel stoppers for the two pn-junctions are exposed in the surface of the moats, then a semiconductor device having a high withstand voltage can be obtained which is very stable against the atmosphere around it and the change in the conditions during fabrication process and the inactive, insulating material for filling the moats.

What we claim is:

1. A semiconductor device comprising
    (a) a semiconductor substrate having first and second main surfaces, at least three semiconductor layers whose conductivity types alternate between said main surfaces and a portion of each of which is exposed, respectively, in said first main surface, two moats provided concentrically in said first main surface in which moats the edges of the pn-junctions formed by said layers are exposed, and channel stopper semiconductor regions which are formed on the surfaces of said layers exposed in said first main surface, each region being highly-doped with respect to its respective underlying layer, and being contiguous to said moats and apart from said pn-junctions, each of said regions having the same conductivity type as the layer on which said region is formed;
    (b) surface passivating material filling said moats; and
    (c) a pair of main electrodes provided on said first and second main surfaces of said substrate.

2. A semiconductor device comprising
    (a) a semiconductor substrate having first and second main surfaces, at least four semiconductor layers whose conductivity types alternate between said main surfaces and a portion of each of which is exposed in said first main surface, two moats provided concentrically in said first main surface in which moats the edges of the nearest two of three pn-junctions formed by said four layers are exposed, and semiconductor regions formed on the surface of the three layers forming said nearest two pn-junctions which are exposed in said first main surface, each region having a high impurity concentration with respect to the concentration of its underlying layer, and being contiguous to said moats and apart from said pn-junctions, each of said regions having the same conductivity type as the layer on which said region is formed;
    (b) surface passivating material filling said moats; and
    (c) a pair of main electrodes provided on said first and second main surfaces.

3. A semiconductor device as claimed in claim 2, wherein said edges of said pn-junctions exposed in the surfaces of said moats cover the entire lengths of said moats.

4. A semiconductor device as claimed in claim 2, wherein the pn-junctions whose edges are exposed in said moats are formed by the three of said four semiconductor layers except the one nearest to said first main surface.

5. A semiconductor device as claimed in claim 2, wherein the inner one of said moats has said edge of said pn-junction exposed in its inner side surface and the outer one of said moats has said edge of said pn-junction exposed in its outer side surface.

6. A semiconductor device as claimed in claim 4, wherein said semiconductor layer nearest to said first main surface is divided into plural portions separate from one another, said first main electrode is also split into plural portions to be provided respectively on said plural portions of said layer, and a gate electrode is so provided on the layer next to said layer nearest to said first main surface as to surround said plural portions of said first main electrode.

7. A semiconductor device comprising (a) a semiconductor substrate having first and second main surfaces, first to fifth semiconductor layers whose conductivity types alternate between said main surfaces, a portion of each of said second to fifth layers being exposed in said first main surface, two moats provided concentrically in said first main surface in which moats the edges of two pn-junctions formed by said second, third and fourth layers are exposed, respectively, and semiconductor regions which are formed on the surfaces of said portions of said second to fourth layers exposed in said first main layer, each region having a high impurity concentration with respect to the concentration of the layer on which it is formed, and contiguous to said moats and apart from said two pn-junctions, each of said regions having the same conductivity type as the layer on which said region is formed;

(b) surface passivating material for filling said moats;

(c) a first main electrode kept in ohmic contact with said first and second layers and a second main electrode kept in ohmic contact with said fourth and fifth layers; and (d) a gate electrode kept in ohmic contact with said fourth layer.

* * * * *